US009572285B2

(12) United States Patent
Long et al.

(10) Patent No.: US 9,572,285 B2
(45) Date of Patent: Feb. 14, 2017

(54) PLUGGABLE MODULE FOR A COMMUNICATION SYSTEM

(71) Applicant: Tyco Electronics Corporation, Berwyn, PA (US)

(72) Inventors: Richard James Long, Columbia, PA (US); Alex Michael Sharf, Harrisburg, PA (US); Steven David Dunwoody, Middletown, PA (US)

(73) Assignee: TYCO ELECTRONICS CORPORATION, Berwyn, PA (US)

( * ) Notice: Subject to any disclaimer, the term of this patent is extended or adjusted under 35 U.S.C. 154(b) by 100 days.

(21) Appl. No.: 14/599,147

(22) Filed: Jan. 16, 2015

(65) Prior Publication Data
US 2016/0211626 A1  Jul. 21, 2016

(51) Int. Cl.
H01R 13/648 (2006.01)
H05K 7/20 (2006.01)
H01R 12/72 (2011.01)
H01R 12/70 (2011.01)
H01R 13/6587 (2011.01)
H01R 13/66 (2006.01)
H01R 25/00 (2006.01)

(52) U.S. Cl.
CPC ........ H05K 7/20436 (2013.01); H01R 12/721 (2013.01); H05K 7/2039 (2013.01); H01R 12/7047 (2013.01); H01R 13/6587 (2013.01); H01R 13/6658 (2013.01); H01R 25/003 (2013.01)

(58) Field of Classification Search
CPC .......................................... H05K 2201/10371

USPC ... 439/76.1, 607.2, 607.46, 607.22; 361/800, 816; 385/92
See application file for complete search history.

(56) References Cited

U.S. PATENT DOCUMENTS

| | | | | |
|---|---|---|---|---|
| 3,784,959 A * | 1/1974 | Horton | ................. | H01R 13/523 439/275 |
| 4,823,235 A * | 4/1989 | Suzuki | ................. | H05K 9/0039 174/354 |
| 4,889,497 A * | 12/1989 | Riches | ................. | H01R 13/648 439/620.08 |
| 5,797,771 A * | 8/1998 | Garside | ............. | H01R 13/6275 439/358 |
| 5,920,459 A * | 7/1999 | Weber | ................. | H01R 13/6215 361/752 |
| 6,179,627 B1 * | 1/2001 | Daly | .................. | H01R 13/6658 439/354 |
| 6,276,943 B1 * | 8/2001 | Boutros | ........... | H01R 13/65802 439/676 |
| 6,347,954 B1 * | 2/2002 | Jones | ................... | G02B 6/4246 439/138 |
| 6,893,293 B2 * | 5/2005 | Ice | ........................ | H05K 9/0058 439/607.2 |

(Continued)

Primary Examiner — Neil Abrams

(57) ABSTRACT

A pluggable module includes a pluggable body extending between a mating end and a cable end. The pluggable body includes a single-piece, unitary shell defining a cavity. The shell is seamless around a perimeter of the shell. An internal circuit board is held in the cavity and surrounded by the unitary shell. The internal circuit board is provided at an end of a cable communicatively coupled to the internal circuit board. The pluggable body is configured to be plugged into a receptacle assembly such that the internal circuit board is communicatively coupled to a communication connector of the receptacle assembly.

20 Claims, 4 Drawing Sheets

(56) References Cited

U.S. PATENT DOCUMENTS

| | | | | |
|---|---|---|---|---|
| 6,994,568 B2* | 2/2006 | Huang | ............... | H01R 13/50 |
| | | | | 235/492 |
| 7,068,522 B2* | 6/2006 | Aronson | ............ | H05K 9/0058 |
| | | | | 361/816 |
| 7,070,450 B2* | 7/2006 | Lin | ............... | H01R 13/5213 |
| | | | | 439/607.02 |
| 7,074,082 B2 | 7/2006 | Kerlin et al. | | |
| 7,172,460 B2* | 2/2007 | Zhao | ............... | H01R 13/6581 |
| | | | | 361/737 |
| 7,486,524 B2* | 2/2009 | Ice | ............... | G02B 6/4277 |
| | | | | 361/737 |
| 7,703,994 B2* | 4/2010 | Kagaya | ............ | G02B 6/4246 |
| | | | | 385/147 |
| 7,753,689 B1* | 7/2010 | Wu | ............... | H01R 13/648 |
| | | | | 439/490 |
| 7,802,929 B2* | 9/2010 | Moore | ............ | G02B 6/4201 |
| | | | | 385/88 |
| 8,328,565 B2* | 12/2012 | Westman | ............ | H01R 12/724 |
| | | | | 439/108 |
| 8,851,929 B2* | 10/2014 | Sorani | ............ | H01R 13/6658 |
| | | | | 361/695 |
| 8,992,258 B2* | 3/2015 | Raschilla | ............ | H01R 13/648 |
| | | | | 439/607.55 |
| 9,130,297 B2* | 9/2015 | Xiao | ............... | H01R 13/512 |
| 9,209,572 B1* | 12/2015 | Dunwoody | ....... | H01R 13/6581 |
| 9,246,278 B1* | 1/2016 | Dunwoody | ....... | H01R 13/6592 |
| 2011/0206328 A1* | 8/2011 | Wang | ............... | G02B 6/4292 |
| | | | | 385/94 |

* cited by examiner

PLUGGABLE MODULE FOR A COMMUNICATION SYSTEM

BACKGROUND OF THE INVENTION

The subject matter described herein relates to a pluggable module for a communication system.

At least some known communication systems include receptacle assemblies, such as input/output (I/O) connector assemblies, that are configured to receive a pluggable module and establish a communicative connection between the pluggable module and an electrical connector of the receptacle assembly. As one example, a known receptacle assembly includes a receptacle housing that is mounted to a circuit board and configured to receive a small form-factor (SFP) pluggable transceiver. The receptacle assembly includes an elongated cavity that extends between an opening of the cavity and an electrical connector that is disposed within the cavity and mounted to the circuit board. The pluggable module is inserted through the opening and advanced toward the electrical connector in the cavity. The pluggable module and the electrical connector have respective electrical contacts that engage one another to establish a communicative connection.

One challenge often encountered in the design of the pluggable module and receptacle assembly is the heat generated during operation of the communication system, which negatively affects module/system reliability and electrical performance. Typically, heat is generated by components on the internal circuit board within the pluggable module and drawn away from the internal circuit board by the metal body of the pluggable module. In some cases, a heat sink that is held by the receptacle assembly housing in direct contact with the metal body of the pluggable module is used to transfer the heat from the pluggable module. Air flowing through and around the receptacle assembly transfers the heat that emanates from the pluggable module. As data throughput speeds of the pluggable modules increase, more heat is generated. Conventional designs are proving to be inadequate for the required heat transfer.

Accordingly, there is a need for a pluggable module for use in a communication system that allows significant heat transfer.

BRIEF DESCRIPTION OF THE INVENTION

In an embodiment, a pluggable module is provided including a pluggable body extending between a mating end and a cable end. The pluggable body includes a single-piece, unitary shell defining a cavity. The shell is seamless around a perimeter of the shell. An internal circuit board is held in the cavity and surrounded by the unitary shell. The internal circuit board is provided at an end of a cable communicatively coupled to the internal circuit board. The pluggable body is configured to be plugged into a receptacle assembly such that the internal circuit board is communicatively coupled to a communication connector of the receptacle assembly.

In a further embodiment, a pluggable module is provided including a cable, an internal circuit board terminated to an end of the cable, and a pluggable body holding the internal circuit board. The internal circuit board has contact pads at an edge thereof communicatively coupled to the cable. The internal circuit board is configured to be plugged into a receptacle assembly such that the contact pads of the internal circuit board are communicatively coupled to a communication connector of the receptacle assembly. The pluggable body extends between a mating end and a cable end. The pluggable body includes a single-piece, unitary shell having a first end and an opposite second end with a first side and an opposite second side extending between the first and second ends along a length of the pluggable body. The first end, second end and sides of the shell define a cavity being open at the mating end and the cable end. The internal circuit board is held in the cavity and is exposed at the mating end for connection to the communication connector. The cable enters the pluggable body through the cable end. A seal is provided at the cable end around the cable to seal the shell to the cable. The shell is seamless around a perimeter of the shell along the first end, the first side, the second end, the second side and back to the first end.

In another embodiment, a communication system is provided including a pluggable module having a pluggable body extending between a mating end and a cable end. The pluggable body includes a single-piece, unitary shell defining a cavity. The shell is seamless around a perimeter of the shell. The pluggable module has an internal circuit board held in the cavity. The internal circuit board is provided at an end of a cable communicatively coupled to the internal circuit board. The communication system includes a receptacle assembly having a receptacle housing defining a module cavity with a port opening at a front end of the receptacle housing open to the module cavity. The module cavity receives the pluggable module through the port opening. The receptacle assembly has a communication connector within the receptacle housing at a rear end of the receptacle housing. The pluggable module is pluggably coupled to the communication connector such that the internal circuit board is communicatively coupled to the communication connector.

DETAILED DESCRIPTION OF THE INVENTION

Embodiments set forth herein include communication systems and pluggable modules of the same. The pluggable module provides substantial thermal heat transfer for the components thereof. Various embodiments of the pluggable module include a pluggable body having a cost effective design. Various embodiments of the pluggable module include a pluggable body that facilitates heat transfer. Various embodiments of the communication system include heat sink inserts that guide loading of the pluggable module into a corresponding receptacle assembly and that transfer heat away from the pluggable module body.

Unlike conventional pluggable modules that utilize a multi-piece pluggable body, namely an upper shell and a lower shell, embodiments set forth herein have a unitary body that transfers heat therefrom. In various embodiments, the heat is drawn into one area or portion of the pluggable body and, due to the efficient thermal transfer characteristics of the pluggable body, the heat is transferred to other areas of the pluggable body for dissipation from the pluggable body. For example, heat may be drawn into the top portion of the pluggable body and transferred to the sides and the bottom efficiently to cool the pluggable module.

Figure 1:
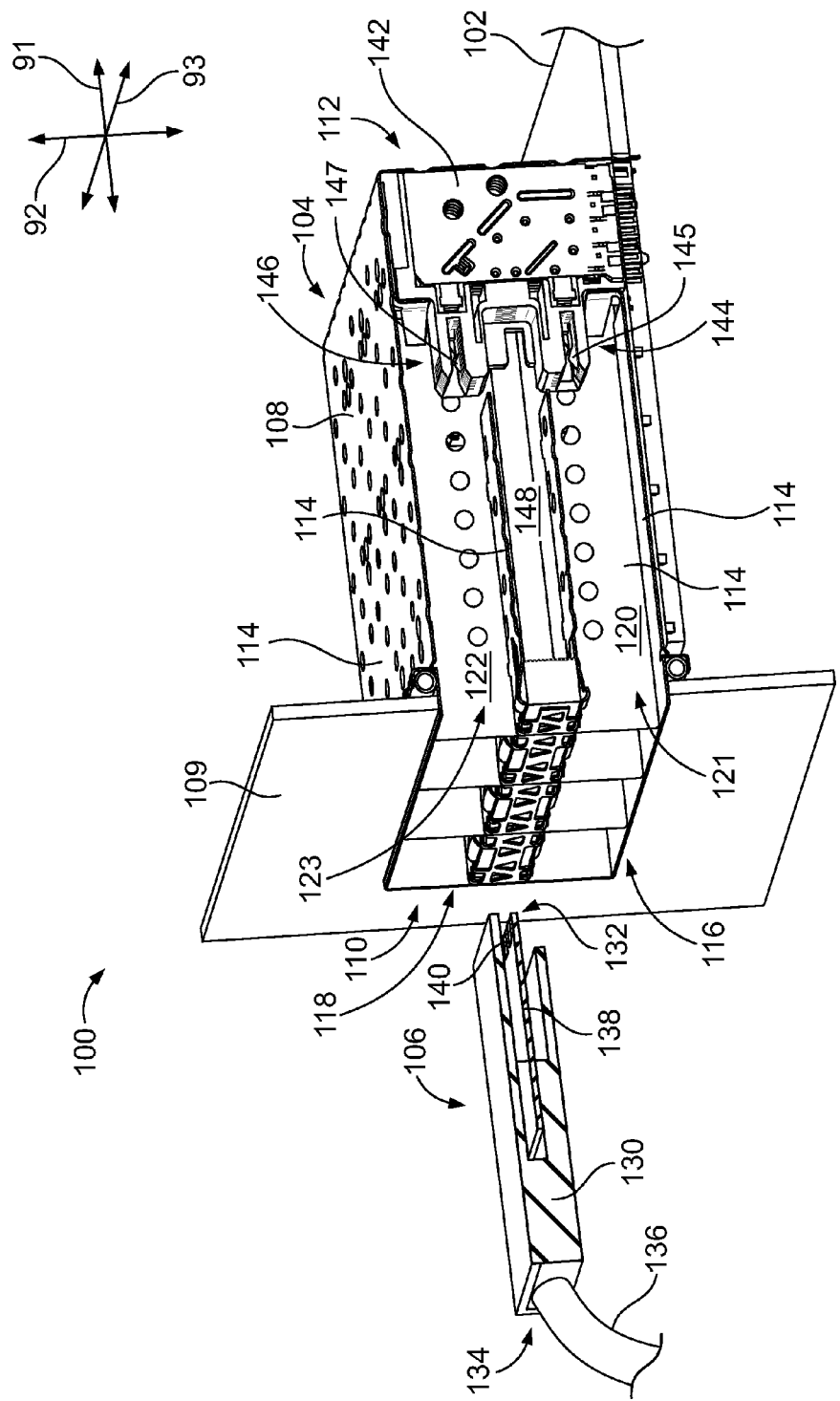
FIG. 1 is a perspective cross-sectional view of a communication system in accordance with an embodiment.

FIG. 1 is a perspective cross-sectional view of a communication system 100 in accordance with an embodiment. The communication system 100 may include a circuit board 102, a receptacle assembly 104 mounted to the circuit board 102, and one or more pluggable modules 106 that are configured to communicatively engage the receptacle assembly 104. The communication system 100 is oriented with respect to a mating or insertion axis 91, an elevation axis 92, and a lateral axis 93. The axes 91-93 are mutually perpendicular. Although the elevation axis 92 appears to extend in a vertical direction parallel to gravity in FIG. 1, it is understood that the axes 91-93 are not required to have any particular orientation with respect to gravity. Moreover, only one pluggable module 106 is shown in FIG. 1, but it is understood that multiple pluggable modules 106 may simultaneously engage the receptacle assembly 104.

The communication system 100 may be part of or used with telecommunication systems or devices. For example, the communication system 100 may be part of or include a switch, router, server, hub, network interface card, or storage system. In the illustrated embodiment, the pluggable module 106 is configured to transmit data signals in the form of electrical signals. In other embodiments, the pluggable module 106 may be configured to transmit data signals in the form of optical signals. The circuit board 102 may be a daughter card or a mother board and include conductive traces (not shown) extending therethrough.

The receptacle assembly 104 includes a receptacle housing 108 that is mounted to the circuit board 102. The receptacle housing 108 may also be referred to as a receptacle cage. The receptacle housing 108 may be arranged at a bezel or faceplate 109 of a chassis of the system or device, such as through an opening in the faceplate 109. As such, the receptacle housing 108 is interior of the device and corresponding faceplate 109 and the pluggable module(s) 106 is loaded into the receptacle housing 108 from outside or exterior of the device and corresponding faceplate 109.

The receptacle housing 108 includes a front end 110 and an opposite back end 112. The front end 110 may be provided at, and extend through an opening in, the faceplate 109. The mating axis 91 may extend between the front and back ends 110, 112. Relative or spatial terms such as "front," "back," "top," or "bottom" are only used to distinguish the referenced elements and do not necessarily require particular positions or orientations in the communication system 100 or in the surrounding environment of the communication system 100. For example, the front end 110 may be located in or facing a back portion of a larger telecommunication system. In many applications, the front end 110 is viewable to a user when the user is inserting the pluggable module 106 into the receptacle assembly 104.

The receptacle housing 108 is configured to contain or block electromagnetic interference (EMI) and guide the pluggable module(s) 106 during a mating operation. To this end, the receptacle housing 108 includes a plurality of housing walls 114 that are interconnected with one another to form the receptacle housing 108. The housing walls 114 may be formed from a conductive material, such as sheet metal and/or a polymer having conductive particles. In the illustrated embodiment, the housing walls 114 are stamped and formed from sheet metal. In some embodiments, the receptacle housing 108 is configured to facilitate airflow through the receptacle housing 108 to transfer heat (or thermal energy) away from the receptacle assembly 104 and pluggable module(s) 106. The air may flow from inside the receptacle housing 108 (for example, behind the faceplate 109) to the external environment (for example, forward of the faceplate 109) or from outside the receptacle housing 108 into the interior of the receptacle housing 108. Fans or other air moving devices may be used to increase airflow through the receptacle housing 108 and over the pluggable module(s) 106.

In the illustrated embodiment, the receptacle housing 108 includes a first (or bottom) row 116 of elongated module cavities 120 and a second (or top) row 118 of elongated module cavities 122. Each of the module cavities 120, 122 extends between the front and back ends 110, 112. The module cavities 120, 122 have respective port openings 121, 123 that are sized and shaped to receive a corresponding pluggable module 106. The module cavities 120, 122 may have the same or similar dimensions and extend lengthwise in a direction that is parallel to the mating axis 91. In the illustrated embodiment, each module cavity 122 is stacked over a corresponding module cavity 120 such that the module cavity 120 is positioned between the module cavity 122 and the circuit board 102. Any number of module cavities may be provided including a single module cavity.

In some embodiments, the pluggable module 106 is an input/output cable assembly having a pluggable body 130. The pluggable body 130 includes a mating end 132 and an opposite cable end 134. A cable 136 is coupled to the pluggable body 130 at the cable end 134. The pluggable body 130 also includes an internal circuit board 138 that is communicatively coupled to electrical wires or optical fibers (not shown) of the cable 136. The cable 136 may be communicatively coupled by directly terminating the wires to the internal circuit board 138, such as by soldering the wires to the internal circuit board. Alternatively, the cable 136 may be communicatively coupled by other processes, such as by using connectors at the end of the cable 136 and on the internal circuit board 138. The internal circuit board 138 is supported by the pluggable body 130. The circuit board 138 includes contact pads 140 at the mating end 132.

In FIG. 1, the mating end 132 is configured to be inserted into the module cavity 122 of the receptacle housing 108 and advanced in a mating direction along the mating axis 91. In an exemplary embodiment, the pluggable body 130 provides heat transfer for the internal circuit board 138, such as for the electronic components on the internal circuit board 138. For example, the internal circuit board 138 is in thermal communication with the pluggable body 130 and the pluggable body 130 transfers heat from the internal circuit board 138. In an exemplary embodiment, the heat is transferred from at or near the mating end 132, such as where various electrical components are located on the internal circuit board 138, to the cable end 134. The heat is pulled out of the receptacle assembly 104 and mating end 132 and rejected to the external environment forward of the faceplate 109. In other embodiments, the heat may be drawn into other portions of the pluggable body 130 and/or the heat may be directed to other portions of the pluggable body 130, such as to the mating end 132 where the heat may be transferred to another heat sink or heat transferring component inside the chassis.

The receptacle assembly 104 includes a communication connector 142 having first and second mating interfaces 144, 146. The first mating interface 144 is disposed within the module cavity 120, and the second mating interface 146 is disposed within the module cavity 122. The first and second mating interfaces 144, 146 are aligned with the port openings 121, 123, respectively. Each of the first and second mating interfaces 144, 146 includes respective electrical contacts 145, 147 that are configured to directly engage the contact pads 140 of the pluggable module 106. Thus, a single communication connector 142 may mate with two pluggable modules 106.

In alternative embodiments, the receptacle assembly 104 does not include the stacked module cavities 120, 122 and, instead, includes only a single row of module cavities 120 or only a single module cavity 120. In such embodiments, the communication connector 142 may have a single row of mating interfaces or a single mating interface.

The pluggable module 106 is an input/output (I/O) module configured to be inserted into and removed from the receptacle assembly 104. In some embodiments, the pluggable module 106 is a small form-factor pluggable (SFP) transceiver or quad small form-factor pluggable (QSFP) transceiver. The pluggable module 106 may satisfy certain technical specifications for SFP or QSFP transceivers, such as Small-Form Factor (SFF)-8431. In some embodiments, the pluggable module 106 is configured to transmit data signals up to 2.5 gigabits per second (Gbps), up to 5.0 Gbps, up to 10.0 Gbps, or more. By way of example, the receptacle assembly 104 and the pluggable module 106 may be similar to the receptacle cages and transceivers, respectively, which are part of the SFP+ product family available from TE Connectivity.

Also shown in FIG. 1, the housing walls 114 of the receptacle housing 108 also form a separator plate 148 between the module cavities 120, 122. The separator plate 148 extends generally parallel to the mating axis 91 between the front end 110 and the back end 112. More specifically, the module cavity 120, the separator plate 148, and the module cavity 122 are stacked along the elevation axis 92. Optionally, a light-indicator assembly (not shown), such as a light pipe may be provided in the separator cavity defined by the separator plate 148. The separator cavity may allow airflow between the module cavities 120, 122 to enhance heat transfer of the pluggable modules 106 located in the module cavities 120, 122.

Figure 2:
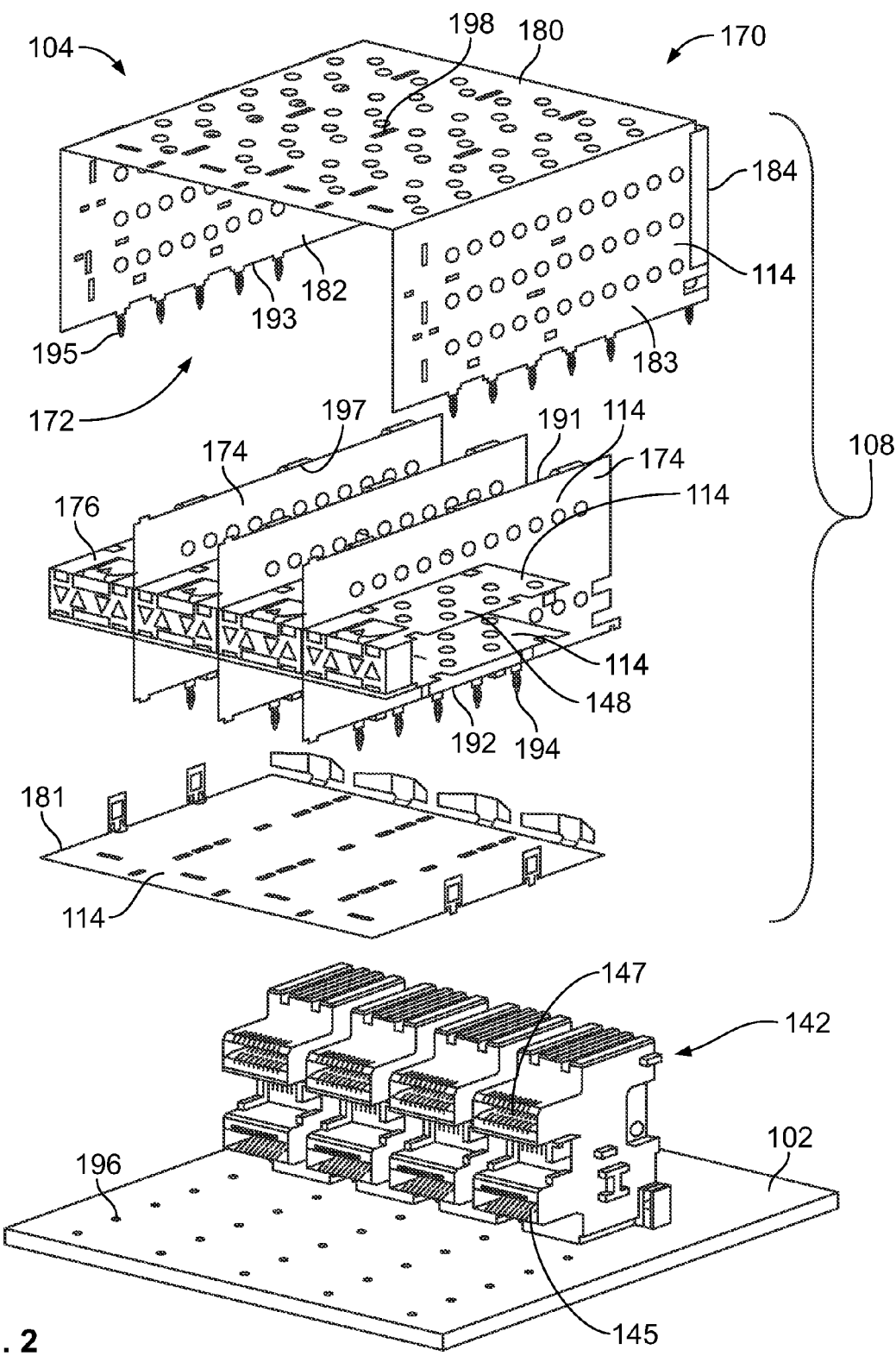
FIG. 2 is a partially exploded view of a receptacle assembly of the communication system shown in FIG. 1.

FIG. 2 is a partially exploded view of the receptacle assembly 104 and illustrates the receptacle housing 108 and a plurality of the communication connectors 142 mounted to the circuit board 102. In some embodiments, the receptacle housing 108 is formed from a plurality of interconnected panels or sheets. For example, the receptacle housing 108 includes a main panel or shell 170 that surrounds a housing cavity 172, a plurality of interior panels 174, a base panel 181, and separator panels 176 defining the separator plate 148. Each of the main panel 170, the interior panels 174, and the separator panels 176 may be stamped and formed from sheet metal. As described in greater detail below, each of the main panel 170, the interior panels 174, and the separator panels 176 may form one or more of the housing walls 114 that define the module cavity 120, the module cavity 122, and the separator plate 148 as shown in FIG. 1. As shown in FIG. 2, the main panel 170 includes an elevated wall 180, sidewalls 182, 183, and a back wall 184. The elevated wall 180 is located furthest from the circuit board 102 when the receptacle assembly 104 is constructed. The base panel 181 may rest on the circuit board 102. The sidewalls 182, 183 and the back wall 184 are configured to extend from the circuit board 102, when mounted thereto, to the elevated wall 180.

The interior panels 174 and the separator panels 176 are configured to be positioned within the housing cavity 172. Within the main panel 170, the interior panels 174 and the separator panels 176 apportion or divide the housing cavity 172 into the separate module cavities 120, 122 (FIG. 1) and the separator cavity of the separator plate 148 (FIG. 1).

In the illustrated embodiment, each of the interior panels 174 has a panel edge 191 that interfaces with the elevated wall 180 and a panel edge 192 that interfaces with the base panel 181 and/or the circuit board 102. The panel edge 192 may include mounting pins or tails 194 that are configured to mechanically engage and electrically couple to vias or thru-holes 196 of the circuit board 102. The panel edge 191 may include tabs or latches 197 that are configured to be inserted through slots 198 of the elevated wall 180 to couple to the elevated wall 180. Likewise, the sidewalls 182, 183 and the back wall 184 may have panel edges 193 that include mounting pins or tails 195 configured to mechanically engage and electrically couple to corresponding vias 196 of the circuit board 102.

The main panel 170, the base panel 181, the interior panels 174, and the separator panels 176 may comprise conductive material, such as metal or plastic. When the receptacle housing 108 is mounted to the circuit board 102, the receptacle housing 108 and the receptacle assembly 104 are electrically coupled to the circuit board 102 and, in particular, to ground planes (not shown) within the circuit board 102 to electrically ground the receptacle housing 108 and the receptacle assembly 104. As such, the receptacle assembly 104 may reduce EMI leakage that may negatively affect electrical performance of the communication system 100 (FIG. 1).

Figure 3:
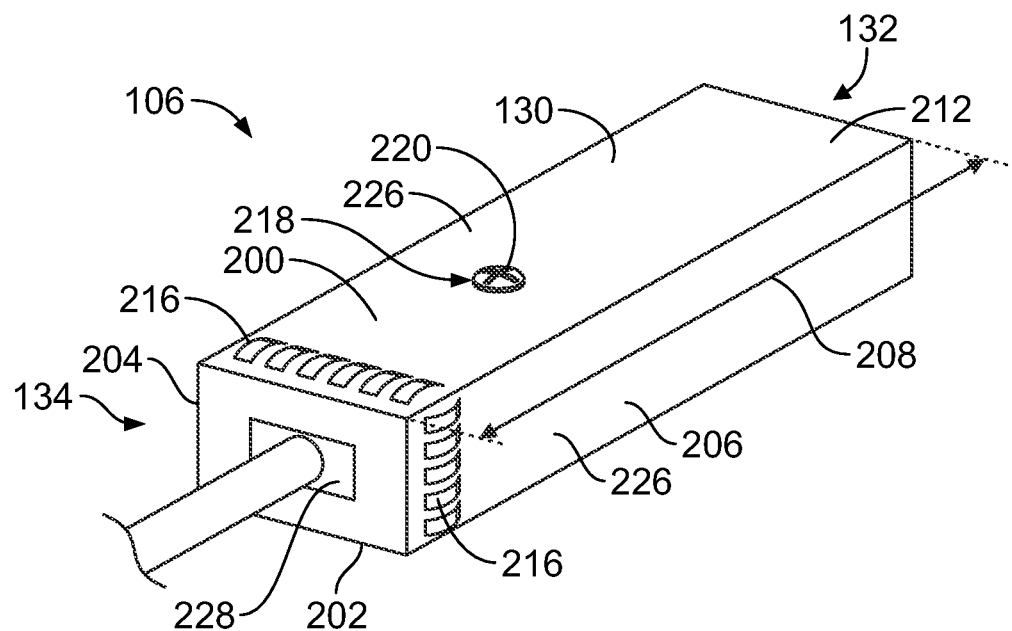
FIG. 3 is a front perspective view of a pluggable module of the communication system formed in accordance with an exemplary embodiment.
Figure 4:
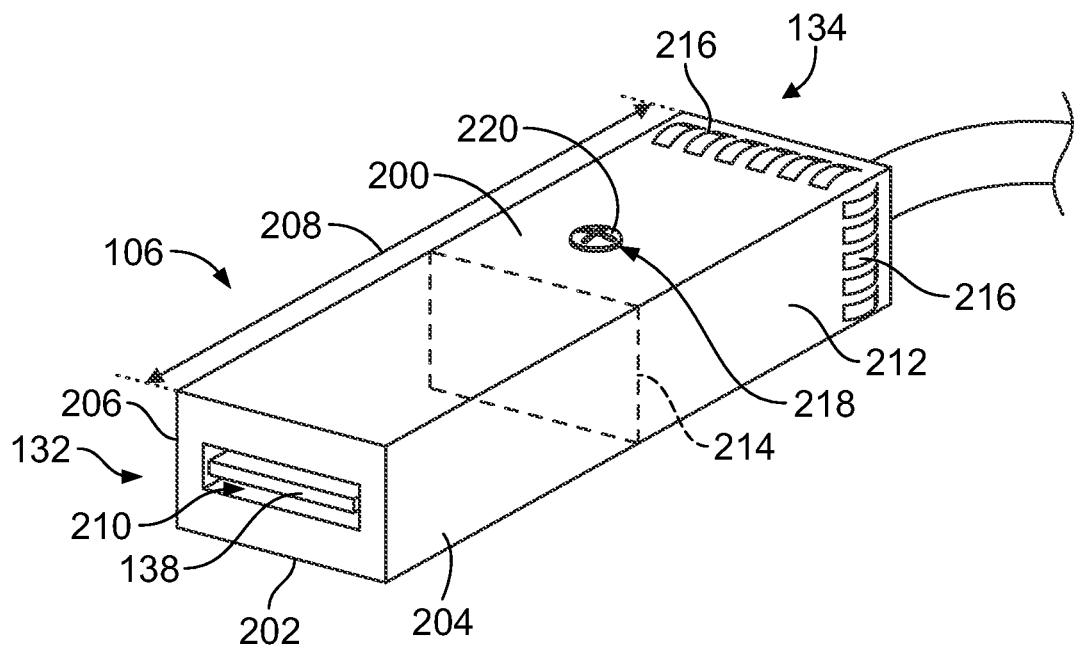
FIG. 4 is a rear perspective view of the pluggable module in accordance with an exemplary embodiment.
Figure 5:
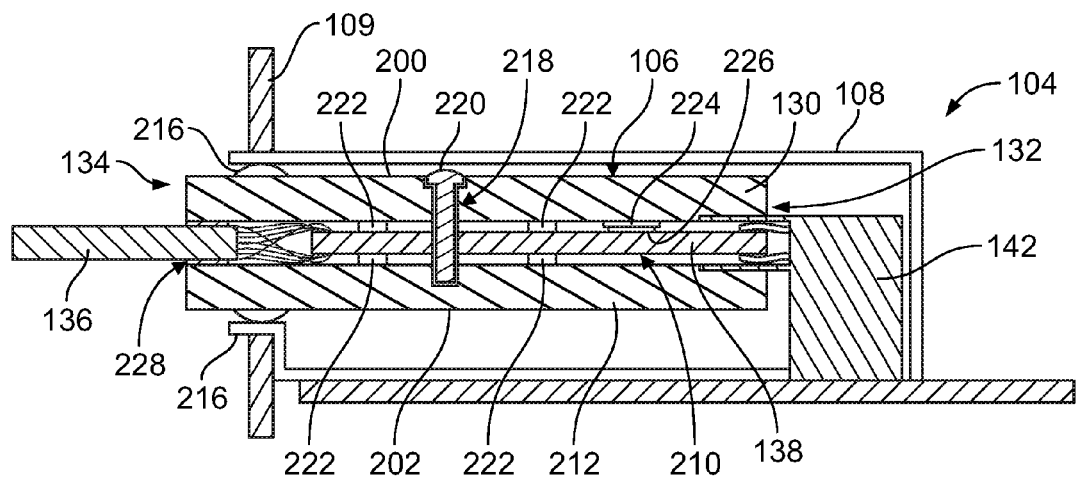
FIG. 5 is a cross-sectional view of the communication system in accordance with an exemplary embodiment.

FIG. 3 is a front perspective view of the pluggable module 106 in accordance with an exemplary embodiment. FIG. 4 is a rear perspective view of the pluggable module 106 in accordance with an exemplary embodiment. FIG. 5 is a cross-sectional view of the pluggable module 106 in the receptacle assembly 104.

The pluggable body 130 holds the internal circuit board 138 (shown in FIGS. 4 and 5). The pluggable body 130 has a first end 200 and an opposite second end 202 with sides 204, 206 extending between the first and second ends 200, 202. The first end 200 defines an upper end or top of the pluggable body 130 while the second end 202 defines a lower end or bottom of the pluggable body 130. The first and second ends 200, 202 and the sides 204, 206 extend lengthwise along a length 208 of the pluggable body 130 between the mating end 132 and cable end 134. The first end 200, second end 202 and sides 204, 206 define a cavity 210 (shown in FIGS. 4 and 5) that holds the internal circuit board 138. Optionally, the internal circuit board 138 may be exposed at the mating end 132 for mating with the corresponding communication connector 142 (shown in FIG. 5).

In an exemplary embodiment, the pluggable body 130 includes a single-piece, unitary shell 212 defining the cavity 210. For example, the ends 200, 202 and sides 204, 206 are formed integral with each other. The shell 212 is continuous around the cavity 210, such as along the first end 200, the first side 204, the second end 202, the second side 206 and back to the first end 200. The shell 212 is seamless around a perimeter 214 of the pluggable body 130. The shell 212 holds the internal circuit board 138. The shell 212 provides EMI shielding for the internal circuit board 138. The internal circuit board 138 is arranged at or near a center plane of the pluggable module 106, which may be centered between the first and second ends 200, 202. In an exemplary embodiment, the pluggable body 130 includes EMI springs 216 around the perimeter 214, such as along the first end 200, the second end 202, the first side 204 and/or the second side 206. The EMI springs 216 are provided at or near the cable end 134. The EMI springs 216 may engage the receptacle housing 108 (shown in FIG. 5) or directly to the faceplate 109 (shown in FIG. 5) when no receptacle housing 108 is used. The EMI springs 216 may be separately provided from the pluggable body 130 and coupled thereto, such as by riveting, welding, adhering, fastening, and the like. Alternatively, the EMI springs 216 may be integrally formed with the ends 200, 202 and/or sides 204, 206.

In an exemplary embodiment, the pluggable body 130 is used for heat transfer from the internal circuit board 138. The pluggable body 130 is manufactured from a thermally conductive material for efficient heat transfer. In an exemplary embodiment, the pluggable body 130 is manufactured from a metal material, such as copper, aluminum, zinc, and the like. The pluggable body 130 has a high thermal conductivity. Optionally, the pluggable body 130 may be die-cast or machined. Alternatively, the pluggable body 130 may be formed by other processes, such as being extruded. In other alternatively embodiments, the pluggable body 130 may be manufactured from a plated plastic material. The pluggable body 130 is placed in thermal communication with the internal circuit board 138. Heat generated by the internal circuit board 138 is drawn into the pluggable body 130 and transferred therefrom. Because the pluggable body 130 is a unitary, one-piece design, the heat may be efficiently transferred into all portions of the pluggable body 130. For example, the heat may be drawn into the first end 200 and transferred into both sides 204, 206 and into the second end 202 without any thermal breaks or interfaces. In contrast, conventional pluggable bodies, made from an upper shell and a lower shell, include a seam at the interface between the shells. Heat is not transferred across such seam efficiently because of the discontinuity in materials, such as due to air between the shells from a lack of contact along the interface. As such, only about half of the pluggable body of conventional pluggable modules is used for heat transfer. Having the pluggable body 130 comprise a single shell 212 allows more heat to be transferred by the pluggable body 130 than with conventional pluggable body shells.

In an exemplary embodiment, the pluggable module 106 includes one or more openings 218 in the shell 212 that receives a securing mechanism 220. The securing mechanism 220 may be a fastener, such as a threaded fastener. The securing mechanism 220 may be a latch or other feature used to secure the internal circuit board 138 in the shell 212. The securing mechanism 220 may pass through the internal circuit board 138 to hold the internal circuit board 138 in the cavity 210.

The shell 212 includes at least one circuit board locating feature 222 (shown in FIG. 5) for positioning the internal circuit board 138 in the cavity 210. For example, the circuit board locating features 222 may support the internal circuit board 138 from below and/or the circuit board locating features 222 may support the internal circuit board 138 from above. The circuit board locating features 222 may include grooves or slots to receive the internal circuit board 138. The circuit board locating features 222 may include shoulders or blocks that may engage one or more surfaces of the internal circuit board 138 for locating the internal circuit board 138 in the cavity 210.

The pluggable body 130 includes a thermal interface member 224 extending into the cavity 210 from the first end 200. The thermal interface member 224 is in thermal contact with the internal circuit board 138 and draws heat from the internal circuit board 138 to the pluggable body 130. The thermal interface member 224 may be integral with the pluggable body 130. Alternatively, the thermal interface member 224 may be separately provided from and coupled to the pluggable body 130. The thermal interface member 224 may be a solid metal structure directly engaging the internal circuit board 138; however the thermal interface member 224 may have other structures in alternative embodiments, such as thermal grease or other such thermal material. The thermal interface member 224 may directly engage one or more heat producing components, such as electronic components 226 of the internal circuit board 138, to pull heat from such heat producing components. Optionally, multiple thermal interface members 224 may be provided. The thermal interface members 224 may be provided on one or both sides of the internal circuit board 138. When provided on both sides of the internal circuit board 138, heat may be pulled into both the first end 200 and the second end 202.

In an exemplary embodiment, the cavity 210 is open at the mating end 132 and the cable end 134. Optionally, the opening at the cable end 134 may be approximately the size and/or shape of the cable 136 to allow the cable 136 to pass therethrough. The internal circuit board 138 is exposed at the mating end 132 for connection to the communication connector 142. The cable 136 enters the pluggable body 130 through the cable end 134. In an exemplary embodiment, a seal 228 is provided at the cable end 134 around the cable 136 to seal the shell 212 to the cable 136. The seal 228 provides strain relief for the cable 136. The seal 228 may provide EMI shielding at the cable end 134. For example, the seal 228 may have metal flakes in the compound to reduce EMI leakage and/or the seal 228 may be manufactured from an EMI absorbent material. Optionally, the seal 228 may be injected into the shell 212 at the cable end 134 after the pluggable module 106 is assembled and the internal circuit board 138 is positioned in the shell 212. For example, the seal 228 may be a hot melt injected into the shell 212 around the cable 136. Alternatively, the seal 228 may be a pre-formed component that is positioned in the opening at the cable end 134 after the pluggable module 106 is assembled and the internal circuit board 138 is positioned in the shell 212. Optionally, a seal may be provided at the mating end 132, such as for sealing to the communication connector 142.

Figure 6:
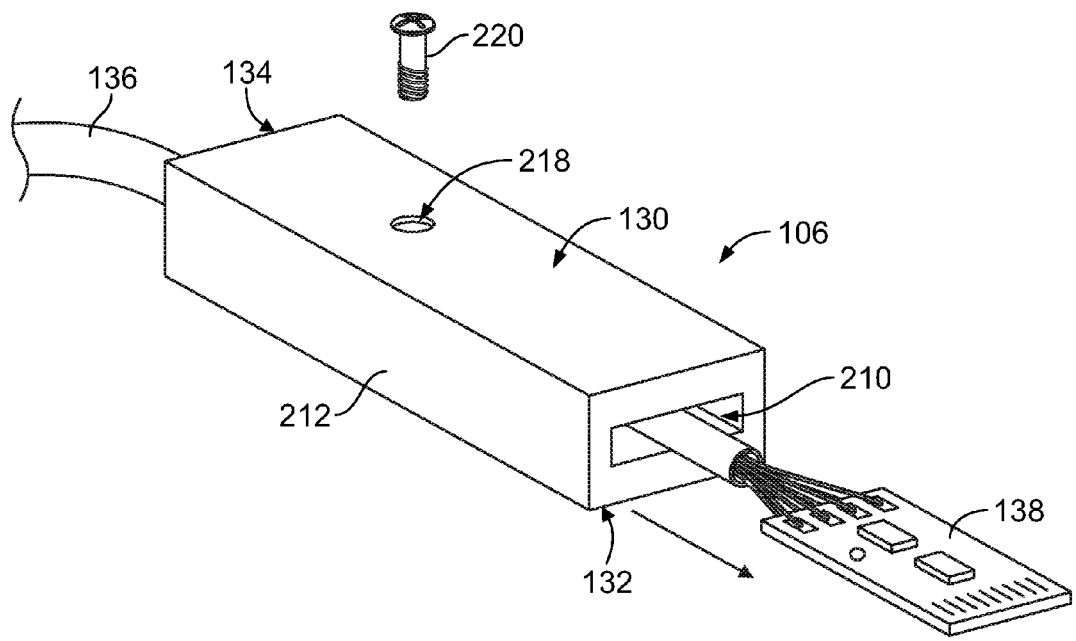
FIG. 6 illustrates the pluggable module during assembly.

FIG. 6 illustrates the pluggable module 106 during assembly. During assembly, the cable 136 is fed through the cable end 134 of the pluggable body 130 and is pressed through the mating end 132. The cable 136 is then terminated to the internal circuit board 138. For example, individual wires of the cable 136 may be soldered or otherwise mechanically and electrically terminated to the internal circuit board 138. The internal circuit board 138 is then loaded into the pluggable body 130. The internal circuit board 138 is loaded into the cavity 210 through the mating end 132. For example, the shell 212 may be pushed over the internal circuit board 138. The internal circuit board 138 is positioned in the cavity 210 by the circuit board locating feature 222 (shown in FIG. 5). The securing mechanism 220 is then loaded into the opening 218 to secure the internal circuit board 138 in the shell 212. The seal 228 (shown in FIG. 5) then seals the cable 136 to the shell 212. For example, the seal 228 may be injected into the cable end 134 around the cable 136.

It is to be understood that the above description is intended to be illustrative, and not restrictive. For example, the above-described embodiments (and/or aspects thereof)

may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. A pluggable module comprising:
a pluggable body extending between a mating end and a cable end, the pluggable body comprising a single-piece, unitary shell defining a cavity, the shell being seamless around a perimeter of the shell, the pluggable body including an opening in the shell;
an internal circuit board held in the cavity and surrounded by the unitary shell, the internal circuit board being provided at an end of a cable communicatively coupled to the internal circuit board, wherein the pluggable body is configured to be plugged into a receptacle assembly such that the internal circuit board is communicatively coupled to a communication connector of the receptacle assembly; and
a securing mechanism received in the opening to engage the internal circuit board and to secure the internal circuit board to the shell.

2. The pluggable module of claim 1, wherein the shell is continuous around the cavity.

3. The pluggable module of claim 1, wherein the shell includes a first end and an opposite second end, and a first side and an opposite second side extending between the first and second ends, the shell being continuous along the first end, the first side, the second end, the second side and back to the first end.

4. The pluggable module of claim 1, wherein the shell includes a first end and an opposite second end, and a first side and an opposite second side extending between the first and second ends, the first end and second end being integral with each other and with the first and second sides.

5. The pluggable module of claim 1, wherein the cavity is open at the mating end and at the cable end, the internal circuit board being exposed at the mating end for connection to the communication connector, a seal being provided at the cable end to seal against the cable.

6. The pluggable module of claim 1, wherein the opening extends through at least one of a first end and a second end of the shell opposite the first end, the securing mechanism extending from an exterior of the shell into the cavity through the opening to secure the internal circuit board to the shell.

7. The pluggable module of claim 1, wherein the internal circuit board is loaded into the shell through the mating end.

8. The pluggable module of claim 1, wherein the shell includes a circuit board locating feature for locating the internal circuit board in the cavity.

9. The pluggable module of claim 1, wherein the shell includes a first end and an opposite second end, and a first side and an opposite second side extending between the first and second ends, the pluggable module further comprising a thermal interface member extending into the cavity from the first end, the thermal interface member being thermally coupled with the internal circuit board, the shell transferring the heat from the first end into both the first and second sides and into the second end to facilitate cooling the pluggable body.

10. The pluggable module of claim 9, wherein the heat is transferred from the first end to the first and second sides and the second end without passing through an interface.

11. A pluggable module comprising:
a cable;
an internal circuit board communicatively coupled to the cable, the internal circuit board having contact pads at an edge thereof communicatively coupled to the cable, wherein the internal circuit board is configured to be plugged into a receptacle assembly such that the contact pads of the internal circuit board are communicatively coupled to a communication connector of the receptacle assembly; and
a pluggable body holding the internal circuit board, the pluggable body extending between a mating end and a cable end, the pluggable body comprising a single-piece, unitary shell having a first end and an opposite second end with a first side and an opposite second side extending between the first and second ends along a length of the pluggable body, the pluggable body including an opening in the shell, the first end, second end and sides of the shell defining a cavity being open at the mating end and the cable end, the internal circuit board being held in the cavity and being exposed at the mating end for connection to the communication connector, the cable entering the pluggable body through the cable end, a seal being provided at the cable end around the cable to seal the shell to the cable, the shell being seamless around a perimeter of the shell along the first end, the first side, the second end, the second side and back to the first end; and
a securing mechanism received in the opening to engage the internal circuit board and to secure the internal circuit board to the shell.

12. The pluggable module of claim 11, wherein the first end and second end are integral with each other and with the first and second sides.

13. A communication system comprising:
a pluggable module having a pluggable body extending between a mating end and a cable end, the pluggable body comprising a single-piece, unitary shell defining a cavity, the shell being seamless around a perimeter of the shell, the pluggable body including an opening in the shell receiving a securing mechanism, and the pluggable module having an internal circuit board held in the cavity by the securing mechanism, the internal circuit board being provided at an end of a cable communicatively coupled to the internal circuit board; and a receptacle assembly having a receptacle housing defining a module cavity with a port opening at a front end of the receptacle housing open to the module cavity, the module cavity receiving the pluggable module through the port opening, the receptacle assembly having a communication connector within the receptacle housing at a rear end of the receptacle housing, the pluggable module being pluggably coupled to the communication connector such that the internal circuit board is communicatively coupled to the communication connector.

14. The communication system of claim 13, wherein the shell is continuous around the cavity.

15. The communication system of claim 13, wherein the shell includes a first end and an opposite second end, and a first side and an opposite second side extending between the first and second ends, the shell being continuous along the first end, the first side, the second end, the second side and back to the first end.

16. The communication system of claim 13, wherein the shell includes a first end and an opposite second end, and a first side and an opposite second side extending between the first and second ends, the first end and second end being integral with each other and with the first and second sides.

17. The communication system of claim 13, wherein the cavity is open at the mating end and at the cable end, the internal circuit board being exposed at the mating end for connection to the communication connector, a seal being provided at the cable end to seal against the cable.

18. The communication system of claim 13, wherein the opening extends through at least one of a first end and a second end of the shell opposite the first side, the securing mechanism extending from an exterior of the shell into the cavity through the opening to secure the internal circuit board to the shell.

19. The communication system of claim 13, wherein the shell includes a first end and an opposite second end, and a first side and an opposite second side extending between the first and second ends, the pluggable module further comprising a thermal interface member extending into the cavity from the first end, the thermal interface member being thermally coupled with the internal circuit board, the shell transferring the heat from the first end into both the first and second sides and into the second end to facilitate cooling the pluggable body.

20. The communication system of claim 19, wherein the heat is transferred from the first end to the first and second sides and the second end without passing through an interface.

* * * * *